(12) United States Patent
Muramatsu et al.

(10) Patent No.: US 6,290,118 B1
(45) Date of Patent: Sep. 18, 2001

(54) METHOD AND APPARATUS FOR SOLDERING AND SOLDERING LAND OF A PRINTED CIRCUIT BOARD

(75) Inventors: Masayoshi Muramatsu; Kenichi Watanabe, both of Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/499,761

(22) Filed: Feb. 8, 2000

Related U.S. Application Data

(62) Division of application No. 09/014,567, filed on Jan. 28, 1998, now Pat. No. 6,045,025.

(30) Foreign Application Priority Data

Feb. 3, 1997 (JP) .................................................... 9-020159
Feb. 24, 1997 (JP) .................................................... 9-039002

(51) Int. Cl.[7] .................................................... B23K 31/00
(52) U.S. Cl. .................... 228/179.1; 228/45; 228/51; 228/52; 228/53
(58) Field of Search .................. 228/179.1, 45, 228/51, 52, 53; 219/85.1, 85.22

(56) References Cited

U.S. PATENT DOCUMENTS

| | | | |
|---|---|---|---|
| 3,887,904 | 6/1975 | Krag | 340/174 MA |
| 4,678,886 * | 7/1987 | Kawaguchi | 219/85 R |
| 4,851,614 | 7/1989 | Duncan, Jr. | 174/68.5 |

FOREIGN PATENT DOCUMENTS

2145646 A * 4/1985 (GB) .................. B23K/3/00

* cited by examiner

*Primary Examiner*—M. Alexandra Elve
(74) *Attorney, Agent, or Firm*—Sughrue, Mion, Zinn, Macpeak & Seas, PLLC

(57) ABSTRACT

A pair of soldering irons are fixed to a sliding plate at a predetermined interval. The soldering irons are integrally moved so as to reciprocate in a rectangular direction relative to a conveyor belt. One of the soldering irons is conveyed to a working position of the conveyor belt and the other of them is separated from the conveyor belt. While one of the soldering irons solders a circuit board, the other is cleaned. The circuit board has a slit into which a metal plate is inserted and soldered. For the slit, a soldering land constituted of a main-land and a sub-land is provided. The main-land is formed along one of longer sides of the slit. The sub-land is elongated from the main-land along a shorter side of the slit. The soldering land is not formed all around the slit so that the slit is not closed by solder when the circuit board is dip-soldered.

9 Claims, 4 Drawing Sheets ic # METHOD AND APPARATUS FOR SOLDERING AND SOLDERING LAND OF A PRINTED CIRCUIT BOARD

This is a divisional of application Ser. No. 09/014,567 filed Jan. 28, 1998, now U.S. Pat. No. 6,045,025 the disclosure of which is incorporated herein by reference.

BACKGROUND OF THE INVENTION

1. Field of the Invention

The present invention relates to a method and an apparatus for soldering for a work conveyed to a predetermined working position by using soldering irons. Further, the present invention relates to a soldering land of a printed circuit board having a slit which is formed for inserting a metal plate.

2. Description of the Related Art

In a conventional soldering method, a soldering iron is disposed above a manufacturing line by which printed circuit boards are successively conveyed. On the printed circuit board, circuit components are mounted. The soldering iron descends toward the printed circuit board conveyed to a predetermined working position and soldering is automatically performed, supplying solder to a tip of the heated soldering iron. In this method, if oxidized solder gathers around the iron tip, soldering performance is greatly lowered. Therefore, an air blow is carried out to clean the iron tip once in five to twenty times of the soldering.

As to the above method, working of the soldering is interrupted while cleaning is carried out. Thus, operating efficiency of equipment is low. Further, upon carrying out the cleaning by the air blow, temperature of the iron tip lowers. Accordingly, there arises a problem in that poor soldering is frequently performed just after the cleaning of the iron tip. Moreover, when the cleaning is carried out once in a plurality of times of the soldering, the soldering is performed in a state that new solder is supplied to the iron tip with old solder thereon until next cleaning step is carried out. Accordingly, it is difficult to keep the solder of the iron tip at a constant amount. In view of this, there is a fear that uniform soldering is not performed.

By the way, when a circuit board is manufactured, dip soldering is performed in the following manner. Metal pins of electronic parts are inserted into holes formed in the circuit board on which wiring is printed. A face of the printed circuit board, from which the metal pins project, is dipped in a tub containing the solder melted by a heater. Then the metal pins are soldered together.

On the other hand, for circuit components protruding from the printed circuit board, a metal plate is provided in order to increase strength of its attachment by enlarging a soldering area. This metal plate is inserted into a slit formed in the printed circuit board after the printed circuit board was dip-soldered. The slit has a soldering land formed all around the slit. After insertion of the metal plate, the metal plate is soldered.

However, as shown in FIG. 5A, if a soldering land 81 is formed all around a slit 80, the slit 80 is sometimes closed by tension of solder 82 adhering to the soldering land 81 when the dip soldering is performed. The state that the slit 80 is closed with the solder is shown in FIG. 5B.

Moreover, as shown in FIG. 6A, when a soldering land 91 is formed half around the slit 80 in order to prevent from closing the slit 80, the slit 80 is not closed by the dip soldering. However, when a metal plate 93 is inserted into the slit 80 and soldered, the solder hardly goes round to the other side of the slit 80 where the soldering land dose not exist. Thus, there arises a problem in that unsatisfactory soldering tends to be performed and sufficient strength is not obtained.

SUMMARY OF THE INVENTION

In view of the foregoing, it is a primary object of the present invention to provide a soldering method and apparatus in which operating efficiency of equipment is improved and good soldering is performed.

It is a second object of the present invention to provide a soldering method and apparatus in which uniform soldering is performed.

It is a third object of the present invention to provide a soldering land of a printed circuit board in which a slit formed in the printed circuit board is prevented from being closed when dip soldering is performed.

It is a fourth object of the present invention to provide a soldering land of a printed circuit board in which it is possible to perform good soldering for a metal plate inserted into a slit formed in the printed circuit board.

In order to achieve the above and other objects, the soldering method and apparatus according to the present invention comprises a plurality of soldering irons fixed to a sliding plate at a predetermined interval. Further, the soldering land according to the present invention comprises a main-land and a sub-land.

In a preferred embodiment, The soldering irons and the sliding plate are integrally moved by a plunger which is fixed to one end of the sliding plate. The soldering irons reciprocate by a predetermined distance in a rectangular direction relative to a conveyor belt. One of the soldering irons is moved to a working position where soldering is performed for a work put on the conveyor belt. At the same time, the other of the soldering irons is separated from the working position and moved to a cleaning position. While one of the soldering irons solders for the work, the other of them is cleaned at the cleaning position by a nozzle shooting air.

The soldering land according to the present invention is constituted of the main-land and the sub-land. The main-land is formed along only one of longer sides of the slit formed in the printed circuit board. The sub-land is elongated from the main-land along a shorter side of the slit. The soldering land is not formed all around the slit so that solder does not spread over the slit when dip soldering of the circuit board is performed. Accordingly, the slit is prevented from being covered with the solder. After the dip soldering, the metal plate is inserted into the slit and soldered. When the metal plate is soldered, the solder adheres to the metal plate along not only the main-land but also the sub-land. Thus, great strength for soldering the metal plate is obtained.

BRIEF DESCRIPTION OF THE DRAWINGS

The above objects and advantages of the present invention will become apparent from the following detailed description of the preferred embodiments of the invention when read in conjunction with the accompanying drawings, in which.

DETAILED DESCRIPTION OF THE PREFERRED EMBODIMENT(S)

Figure 1:
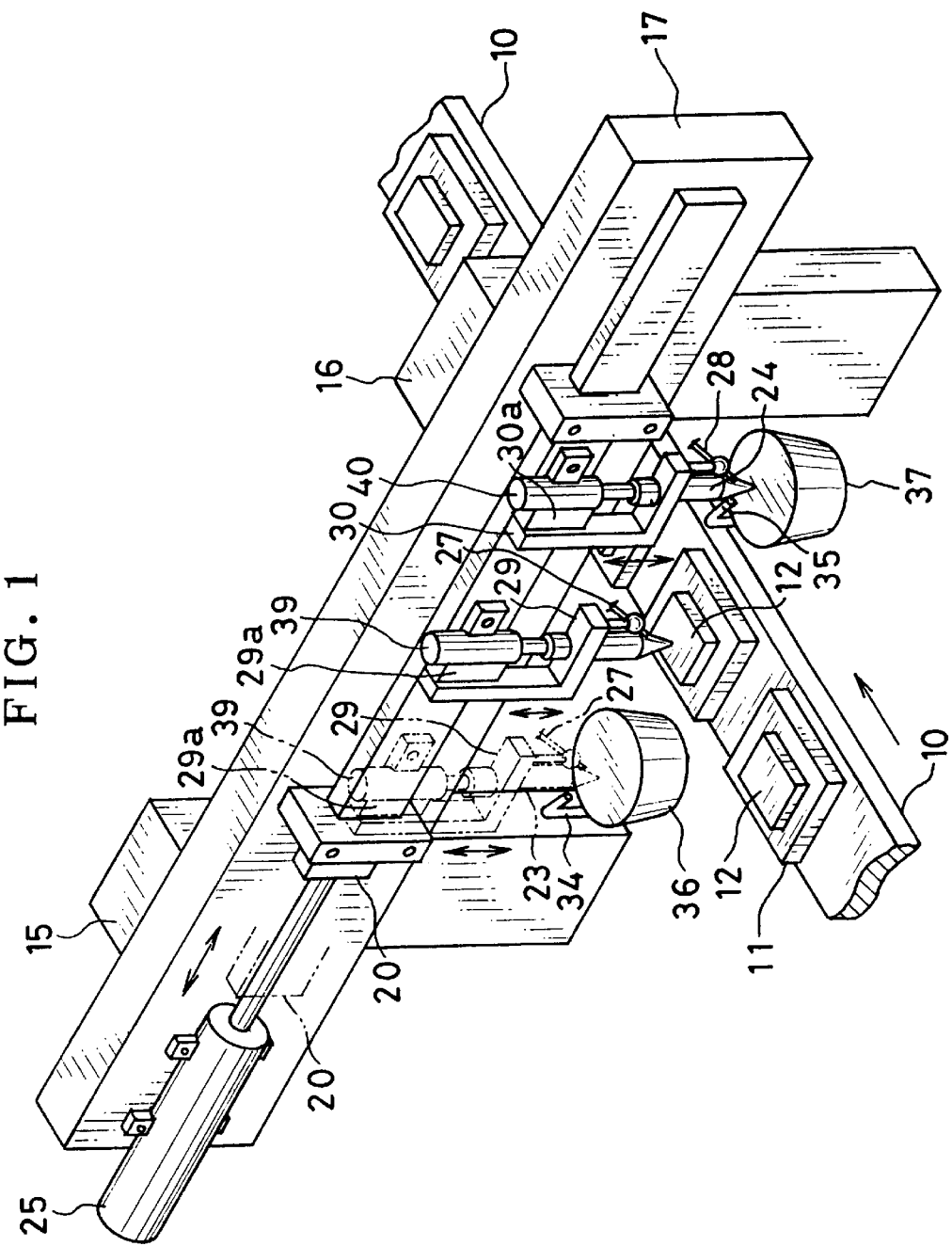
FIG. 1 is a perspective view of a soldering apparatus according to the present invention.

Referring to FIG. 1, an embodiment according to the present invention is described. On a conveyor belt 10, work holders 11 are successively disposed at an unfixed interval. The work holder 11 holds a work 12 for which soldering is performed. The conveyor belt 10 moves intermittently in a direction represented by an arrow shown in FIG. 1. The work 12 is conveyed to a predetermined position in order. At the predetermined position, the soldering is performed by a soldering apparatus. The work holders 11 may be successively disposed on the conveyor belt 10 at a constant interval. In this case, the conveyor belt 10 is intermittently moved in a fixed cycle.

Structure of the soldering apparatus according to the present invention is described below. Posts 15 and 16 are disposed at symmetric positions relative to the conveyor belt 10. A base member 17 is fixed to the posts 15 and 16 in a rectangular direction relative to the conveyor belt 10. The base member 17 is provided with a sliding plate 20 which is slidable in a horizontal direction. The sliding plate 20 is provided with a pair of soldering irons 23 and 24 disposed at a predetermined interval. The soldering iron 23 is fixed to a plunger of a cylinder 39 for moving the soldering iron 23 in up-and-down direction. The soldering iron 24 is fixed to a plunger of a cylinder 40 for moving the soldering iron 24 in up-and-down direction. The cylinders 39 and 40 are fixed to the sliding plate 20.

A cylinder 25 is attached to the base member 17 and a plunger of the cylinder 25 is fixed to one end of the sliding plate 20. The cylinder 25 constitutes a moving means of the soldering irons 23 and 24. The moving means reciprocates the soldering irons 23 and 24 by a predetermined distance In a rectangular direction relative to the conveyor belt 10. Either of the soldering irons 23 and 24 is set at the working position of the conveyor belt 10 by the moving means. Reciprocation of the sliding plate 20 is carried out by the cylinder 25 every time of soldering. Thus, the soldering irons 23 and 24 are set at the working position of the conveyor belt 10 one after the other every time of soldering.

Supplying ports of tubes 27 and 28 are respectively disposed near each tip of the soldering irons 23 and 24. The necessary solder for soldering of one time is sent from a solder supplying device (not shown) and automatically supplied to each tip of the soldering irons 23 and 24 from the supplying ports of the tubes 27 and 28. The tubes 27 and 28 are respectively fixed to each end portion of holding members 29 and 30.

Other end portions of the holding members 29 and 30 are respectively attached to each of linear guides 29a and 30a which are fixed to the sliding plate 20. These end portions are slidable in up-and-down direction. The holding members 29 and 30 are respectively fixed to each of the soldering irons 23 and 24. Thus, the soldering iron 23 and the tube 24 are integrally moved with the tubes 27 and 28. The supplying ports of the tubes 27 and 28 are always disposed near the soldering irons 23 and 24 respectively so that optimum supply of the solder is adapted to be performed.

Nozzles 34 and 35 constituting a cleaning means are disposed at symmetric positions relative to the conveyor belt 10. The nozzles 34 and 35 shoot air sent by an air compressor or the like (not shown) from its shooting ports. By shooting air, the nozzle removes the solder remaining around the tip of the soldering iron separated from the working position of the conveyor belt 10. The nozzle cleans one of the soldering irons 23 and 24 while the other of the soldering irons 23 and 24 performs the soldering. Under the nozzles 24 and 25, vessels 36 and 37 are respectively provided to collect the swept solder.

An operation of the above-mentioned soldering apparatus is described below. By moving the sliding plate 20, the soldering iron 23 is moved to the predetermined working position of the conveyor belt 10. At this time, the soldering iron 24 is separated from the conveyor belt 10 and moved to an above position of the vessel 37. When the work 12 is conveyed to the predetermined position, the soldering iron 23 heated at a prescribed temperature is descended by means of the cylinder 39. The soldering iron 23 contacts the work 12 to perform soldering.

At the same time, the soldering iron 24 is descended into the vessel 37 by means of the cylinder 40. While the soldering iron 23 performs soldering, air is shot at the tip of the soldering iron 24 from the nozzle 35 so that cleaning thereof is carried out. By shooting air, the solder remaining on the tip of the soldering iron 24 is swept. The swept away solder is corrected in the vessel 37. As the cleaning is carried out in the vessel 37, dispersion of the solder due to air blow is prevented.

When the soldering and the cleaning of the soldering irons 23 and 24 are over, the cylinders 39 and 40 raise the soldering irons 23 and 24 respectively. After the soldering iron 23 was separated from the work 12 and the soldering iron 24 was drawn out of the vessel 37, the sliding plate 20 is moved in left direction in FIG. 1 by means of the cylinder 25. The cleaned soldering iron 24 is conveyed to the working position of the conveyor belt 10. The used soldering iron 23 is separated from the conveyor belt 10 and moved to the above position of the vessel 36.

When the next work 12 is conveyed to the predetermined position, the cylinder 40 lowers the soldering iron 24 toward the work 12 to perform the soldering. At the same time, the cylinder 39 lowers the soldering iron 23 into the vessel 36. While the soldering is performed by the soldering iron 24, air is shot at the soldering iron 23 from the nozzle 34 to remove the solder remaining on the tip thereof.

When the soldering and the cleaning of the soldering irons 23 and 24 are over, the soldering iron 24 is separated from the work 12 by means of the cylinder 40 and the soldering iron 23 is drawn out of the vessel 36. Successively, the sliding plate 20 is moved in right direction In FIG. 1 by means of the cylinder 25. The cleaned soldering iron 23 is conveyed to the working position of the conveyor belt 10. The used soldering iron 24 is separated from the conveyor belt 10 and moved to the above position of the vessel 37. The process described above is repeated.

By the way, when the cleaning of the soldering iron is carried out by the air blow, the temperature of the tip thereof lowers. However, the temperature of this soldering iron rises up to the prescribed temperature at which good soldering is performed during the movement to the working position of the conveyor belt. Accordingly, it is prevented that poor soldering is performed due to a drop of the tip temperature caused by the cleaning of the air blow. Moreover, while one of the soldering irons performs the soldering, the cleaning of the other is carried out so that there is no waiting time and it is possible to achieve a high operating efficiency of equipment. Further, the cleaning of the soldering iron is carried out every time of the soldering so that the constant amount of solder adheres to the tip of the soldering iron. Accordingly, uniform soldering may be performed.

In the above-described embodiment, the plunger of the cylinder is fixed to each of soldering irons to move the soldering iron in up-and-down direction individually. However, it is possible to move the sliding plate in up-and-down direction together with the base member. In this case, the base member is slidably attached to the posts and a plunger of a cylinder is fixed to each of both ends of the base member to move the base member in up-and-down direction. Moreover, in the above-described embodiment, the sliding plate and the soldering iron are moved by using the cylinder. However, this is not exclusive, for example, a gear train or a cam mechanism may be employed. Further, for the cleaning of the soldering iron, instead of the air blow, it is possible to adopt a method in which the solder is swept by using a roller, cleaning tape, or brush.

As described above, a pair of the soldering irons disposed at the predetermined interval are integrally moved and solder the work conveyed to the predetermined position. The soldering irons are used one after the other. Further, while one of the soldering irons performs the soldering, the other is cleaned. Accordingly, loss of time due to cleaning is prevented and it is possible to achieve the high operating efficiency of equipment. The cleaning of the soldering iron is carried out every time of the soldering so that the amount of the solder adhering to the tip of the soldering iron is kept at constant. Thus, it becomes possible to perform the uniform soldering.

Figure 2A:
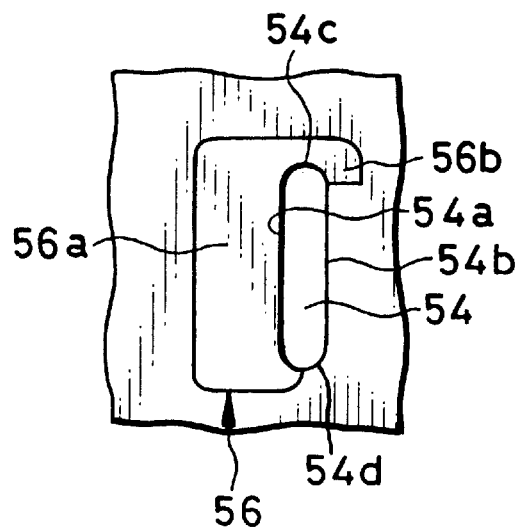
FIGS. 2A, 2B and 2C are explanatory illustrations of a soldering land according to the present invention.
Figure 2B:
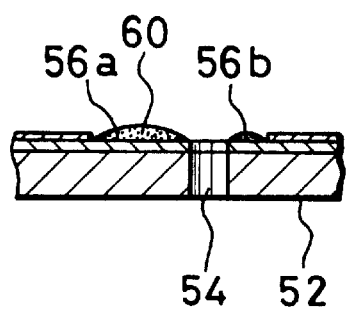
Figure 2C:
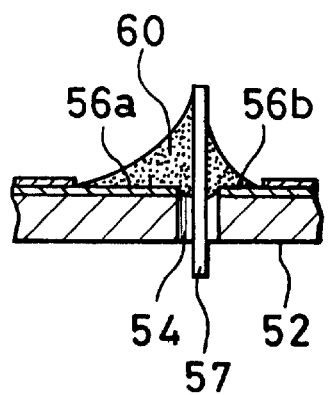
Figure 3:
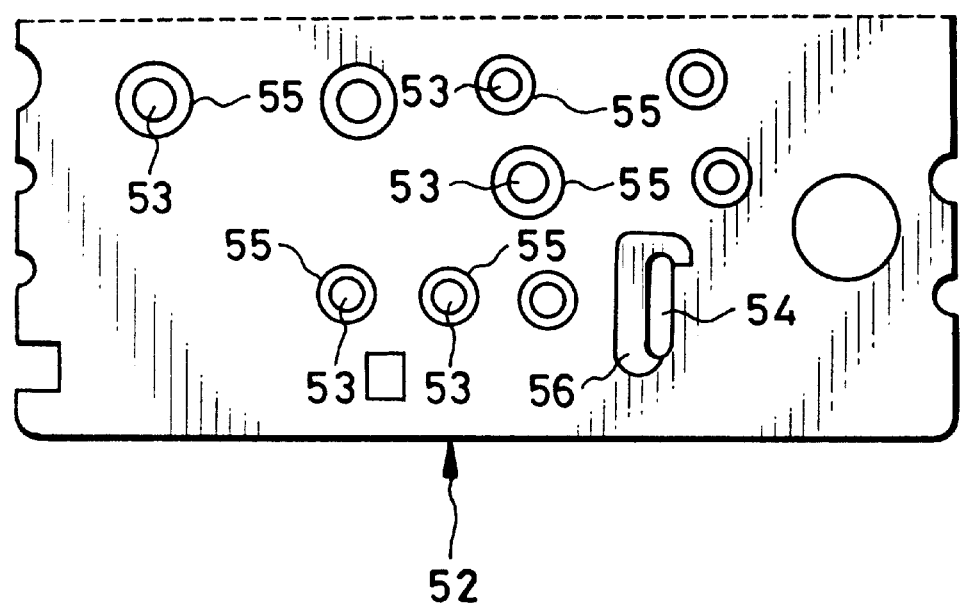
FIG. 3 is a plan view of a printed circuit board provided with the soldering land.
Figure 4:
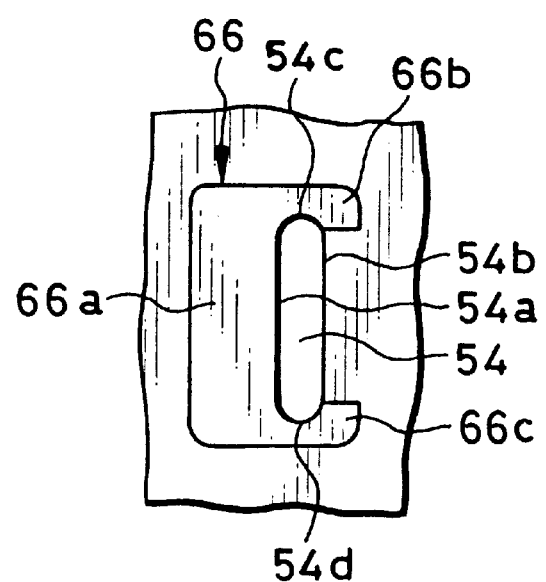
FIG. 4 is an explanatory illustration of another soldering land.
Figure 5A:
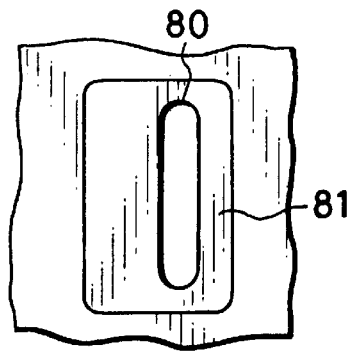
FIGS. 5A and 5B are explanatory illustrations of a conventional soldering land.
Figure 5B:
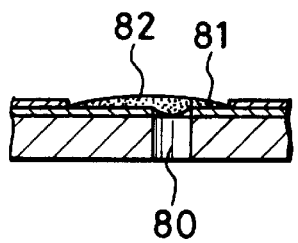
Figure 6A:
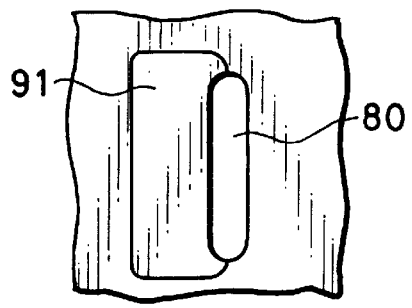
FIGS. 6A and 6B are explanatory illustrations of another conventional soldering land.
Figure 6B:
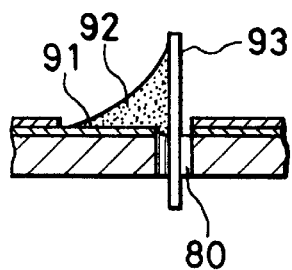

Next, referring to FIGS. 2 to 4, another embodiment according to the present invention is described.

FIG. 3 shows a printed circuit board provided with a soldering land according to the present invention. In the printed circuit board 52, holes 53 and slits 54 are formed. The hole 53 is for inserting a rod-like metal pin of electrical parts and so forth. The slit 54 is for inserting a metal plate 57 which is attached to large-sized circuit components of a switch, a battery holder and so forth. Soldering lands 55 and 56 are formed around the hole 53 and the slit 54 respectively.

Dip soldering is performed for the printed circuit board 52 after the pins of the electrical parts or the like have been inserted into the holes 53. The soldering land 55 is provided all around the hole 53 so that the solder adheres all around the pin inserted into the hole 53.

As shown in FIGS. 2A, 2B and 2C, an outline of the slit 54 is constituted of longer sides 54a and 54b, and arc-shaped shorter sides 54c and 54d connected to the longer sides 54a and 54b. Of course, the shorter side may be linear. The soldering land 56 is constituted of a main-land 56a and a sub-land 56b. The main-land 56a is provided along the longer side 54a. The sub-land 56b is formed so as to be elongated from the main-land 56a along the shorter side 54c and go round to the other longer side 54b.

Referring to FIGS. 2A, 2B and 2C, it is described that the circuit component having the metal plate is soldered to the printed circuit board provided with the above soldering land. When the pins of the electrical parts are inserted into the holes 53 and dip-soldered, solder 60 adheres to the soldering land 56. At this time, as the soldering land 56 does not surround all around the slit 54, the tension of the solder 60 is diagonally applied due to the main-land 56a and the sub-land 56b. Thus, the solder 60 does not spread over the slit 54 so that the slit 54 is prevented from being closed by the dip soldering.

Successively, the metal plate 57 is inserted into the slit 54 and soldered. The solder 60 adheres to the main-land 56a and the sub-land 56b. As the sub-land 56b is formed such as to go round to the other longer side 54b, the solder 60 goes round to the sub-land 56b side of the metal plate 57 besides the main-land 56a side thereof. Accordingly, sufficient strength is obtained.

Another shape of the soldering land according to the present invention is illustrated in FIG. 4. A soldering land 66 shown in FIG. 4 is constituted of a main-land 66a and sub-lands 66b and 66c. The main-land 66a is provided along the longer side 54a of the slit 54. The sub-lands 66b and 66c are formed such that an upper portion and a lower portion of the main-land 66a are elongated along the shorter sides 54c and 54d. The sub-lands 66b and 66c go round to the other longer side 54b. Similar effect to the above embodiment is obtained.

Moreover, in the above-described embodiments, the sub-land is formed such that the main-land provided along one of the longer sides of the slit is elongated along the shorter side of the slit and go round to the other longer sides. However, the sub-land is not exclusive to this. The sub-land may be formed so as to be elongated in a separate direction from the other longer side.

As described above, the soldering land is constituted of the main-land formed along one of the longer sides of the slit and the sub-land elongated from the main-land along the shorter side of the slit. Accordingly, the solder adhering to the soldering land does not spread over the slit so that the slit is not closed. Further, when the metal plate is inserted into the slit and soldered, the solder goes round from the main-land to the sub-land. Accordingly, the solder adheres to not only the metal plate face of the main-land side but also the metal plate face of the sub-land side so that the great strength of the soldering is obtained.

In the above-described first embodiment, the movable member, namely, the sliding plate 20 reciprocates in a straight line. However, the movable member may be rotatable or swingable. For example, a movable arm rotating around a center thereof is used. One end of the arm is positioned above the conveyor belt and the other end thereof is separated from the conveyor belt. A first soldering iron is attached to one end of the arm and a second soldering iron is attached to the other end thereof. When the first soldering iron is set at the working position for soldering for the work put on the conveyor belt, the second soldering iron is separated from the conveyor belt and set at the cleaning position where an air nozzle and a vessel are disposed. Upon rotating the arm by 180 degrees, the second soldering iron moves to the working position and the first soldering iron is separated from the conveyor belt to be set at the cleaning position. The center of the arm may be positioned not only above the conveyor belt but also away from the conveyor belt. Moreover, stop position of the arm may be a position crossing the conveyor belt diagonally besides a rectangular position relative to the conveyor belt. Further, instead of rotating the arm in a same direction every 180 degrees, the arm may be alternately rotated in both directions every 180 degrees. Besides the arm, it is possible to use a disk or a sector.

Although the present invention has been fully described by way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A soldering method for soldering for a work moving on a conveyor line, said soldering method comprising the steps of:

moving a movable member cyclically between a first position and a second position, a first soldering iron and a second soldering iron being at least attached to said movable member;

soldering with said first soldering iron and cleaning said second soldering iron when said movable member is set at said first position; and soldering with said second soldering iron and cleaning said first soldering iron when said movable member is set at said second position.

2. A soldering method according to claim 1, wherein said conveyor line is a conveyor belt on which a plurality of said works are put at a predetermined pitch, said conveyor belt being intermittently moved by said pitch and soldering being performed while said conveyor belt stops.

3. A soldering method according to claim 2, wherein said movable member moves in a rectangular direction relative to a moving direction of said conveyor belt.

4. A soldering method according to claim 3, wherein said first soldering iron and said second soldering iron are disposed at an interval L and said first position is away from said second position by a same distance with said interval L.

5. A soldering method according to claim 4, wherein said first soldering iron and said second soldering iron are cleaned by shooting air so as to remove solder remaining on tips of said soldering irons.

6. A soldering method for soldering for a work during conveyance thereof, said soldering method comprising the steps of:

moving a movable member to which a first soldering iron and a second soldering iron are attached at a predetermined interval, said movable member being moved by a prescribed distance in order to set said first soldering iron at a first cleaning position for cleaning and to set said second soldering iron at a working position for soldering;

soldering for said work with said second soldering iron set at said working position;

cleaning said first soldering iron set at said first cleaning position while soldering for said work is performed; and returning said movable member by said prescribed distance in order to set said first soldering iron at said working position and to set said second soldering iron at a second cleaning position for cleaning.

7. A soldering method according to claim 6, wherein said movable member is a sliding plate reciprocating in a rectangular direction relative to a conveying direction of said work.

8. A soldering method according to claim 7, wherein said soldering irons are cleaned by shooting air so as to remove solder remaining on a tip of said soldering iron.

9. A soldering method according to claim 8, further comprising the step of:

collecting said removed solder with a vessel disposed at said cleaning position.

* * * * *